United States Patent [19]

Asano et al.

[11] 4,340,943
[45] Jul. 20, 1982

[54] MEMORY DEVICE UTILIZING MOS FETS

[75] Inventors: Masamichi Asano, Tokyo; Hiroshi Iwahashi, Yokohama, both of Japan

[73] Assignee: Tokyo Shibaura Denki Kabushiki Kaisha, Japan

[21] Appl. No.: 153,951

[22] Filed: May 28, 1980

[30] Foreign Application Priority Data

May 31, 1979 [JP] Japan .................................54/68033
May 31, 1979 [JP] Japan .................................54/68034
Aug. 10, 1979 [JP] Japan................................54/101182

[51] Int. Cl.³ ........................ G11C 7/00; G11C 11/40
[52] U.S. Cl. .................................. 365/194; 369/210; 369/239
[58] Field of Search ............... 365/189, 191, 194, 198, 365/201, 203, 206, 207, 208

[56] References Cited

U.S. PATENT DOCUMENTS

| | | | |
|---|---|---|---|
| 3,638,039 | 1/1972 | Chen et al. | 365/203 X |
| 3,688,264 | 8/1972 | Dingwall | 365/203 |
| 3,866,061 | 2/1975 | Wen et al. | 365/194 X |
| 4,045,785 | 8/1977 | Kirkpatrick, Jr. | 365/208 X |
| 4,085,458 | 4/1978 | Ikuzaki et al. | 365/206 |
| 4,122,548 | 10/1978 | Heuber et al. | 365/203 |
| 4,196,363 | 4/1980 | Malaviya | 365/208 X |
| 4,204,277 | 5/1980 | Kinoshita | 365/203 |
| 4,223,394 | 9/1980 | Pathak et al. | 365/207 X |
| 4,231,110 | 10/1980 | Stinehelfer | 365/194 |

Primary Examiner—Bernard Konick
Assistant Examiner—Donald McElheny, Jr.
Attorney, Agent, or Firm—Finnegan, Henderson, Farabow, Garrett & Dunner

[57] ABSTRACT

A memory device utilizing metal oxide semiconductor field effect transistors (MOS FETs) formed in a semiconductor substrate. The memory device is so improved as to be accessed without a delay and as not to behave erroneously, in spite of a potential variation of data line or the semiconductor substrate. It comprises a plurality of row lines for supplying input signals, a plurality of column lines for supplying output signals, decoders for selecting any one of these lines, a plurality of memory cells connected to the row and column lines in a specific manner, a voltage sensing circuit connected to the column lines, a first potential source connected to the column lines, a second potential source for supplying the memory cells with a source voltage, and means for holding the column lines at a potential substantially equal to the voltage supplied from the second potential source when the potential of the column lines or the substrate varies.

16 Claims, 21 Drawing Figures ($1 \leq h \leq n$)

FROM CELL
TO OUTPUT CIRCUIT

INVERTERS

MEMORY DEVICE UTILIZING MOS FETS

This invention relates to a memory device utilizing metal oxide semiconductor field effect transistors (MOS FETs) which comprises formed in a semiconductor substrate, and more particularly to a memory device which is so improved as to be accessed without a delay and as not to behave erroneously.

BACKGROUND OF THE INVENTION

A memory device of this type has a number of memory cells, which are arranged between row and column lines. In some kind of memory device, each column line may be electrically floating when a chip is not selected. Particularly, the column lines of a MOS memory device come to have a negative potential when the potential of, for example, the semiconductor substrate changes. Thus, a memory device of this type may fail to operate at a high speed or it may operate erroneously.

A known mask ROM comprises memory cells, i.e. MOS FETs formed in a semiconductor substrate, row lines, column lines, a row decoder and a column decoder. The row decoder selects one of the row lines. Each memory cell is driven by voltage supplied through the row line to which it is connected. Of the memory cells, those which have their drains connected to the column lines store a binary value "0". The other memory cells which have their drains not connected to the column lines store a binary value "1". All these memory cells have their sources connected to a second voltage source i.e. ground. The column lines include transistors for selecting one of the column lines, respectively. The gates of these transistors are connected to the column decoder. The column decoder selects and drives one of the transistors included in the column lines. Further provided is a voltage sensing circuit for detecting which binary value, "0" or "1", the column line selected by the column decoder produces. The circuit delivers through an output circuit an output signal which represents which binary value has been produced by the column line selected. All the MOS transistors used in the mask ROM are of N-channel enhancement type. Power source voltage is higher than the ground potential.

In the mask ROM a chip is selected by a chip enable signal. The mask ROM consumes less power when a chip is not selected than when it is selected. To raise the speed with which data is read out from the ROM immediately after the ROM has been enabled by a chip enable signal and to reduce the power consumption, the following measures are taken commonly. That is, all the row lines of the ROM are charged through the row decoder at level "1" when chip is not selected. When a chip is enabled and one of the row lines is selected, all the other row lines are discharged.

FIG. 1 shows the coupling capacitances among the row lines, column lines, substrate and ground potential of the above-described mask ROM. In FIG. 1, $C_1$ is coupling capacitance between a row line and column line, $C_2$ coupling capacitance between a column line and the substrate, $C_3$ coupling capacitance between a column line and the ground, $C_4$ coupling capacitance between a row line and the substrate, and $C_5$ coupling capacitance between the substrate and the ground. As evident from FIG. 1, the row lines have a coupling capacitance with respect to the column lines and the substrate Sub. If the column lines are electrically floating when chip is not selected or enabled, the column lines and the substrate Sub will have a negative potential due to the noise generated when all the row lines are discharged. Of course, the column lines and the substrate Sub will have a positive potential when the row lines are charged.

Further, if there is a power source noise, the potential of the substrate will vary. Such a potential variation changes the potential of the column lines which are electrically floating. Moreover, a potential variation of internal nodes (e.g. the row lines), if any, changes the potential of the column lines through the gates of the memory cells. Further, in an integrated circuit with three power sources in which a bias voltage is applied to the substrate, the potential of the column lines tends to drop to the potential of the substrate due to current leaking from the column lines or from the PN junctions of the drains of the memory cells when the column lines are not selected and electrically floating. Thus, when the potential of the column lines drops to "$V_G-V_{th}$", where $V_G$ is the gate voltage of the transistors included in the column lines and $V_{th}$ is the threshold voltage thereof, the transistors are turned on whereby the column lines are held at a negative voltage lower than the source potential which is usually 0 volt.

In an EPROM (Erasable Programmable ROM) which is exposed to external light, the nodes (e.g. column lines) which are put in a floating state by the current generated in the PN junction by the external light will inevitably have their potential reduced to a negative potential which is lower than the potential of the substrate (usually 0 volt) by the forward voltage of the PN junction. If this happens, the column line which has been selected must be charged to have a higher potential than said negative potential, and such necessary charging of the selected column line will reduce the data-reading speed. If the substrate potential becomes a negative one, the capacitance among the column lines reduces the potential of all the unselected column lines to a negative potential. Thus, all the transistors for selecting the column lines, which have been in an off state, are rendered conductive. Through these transistors each column lines is charged. As a result, the data reading speed will be much reduced if data are read out under this condition.

If said charge phenomenon takes place right after the data reading, the potential of the selected column line is lowered. The potential of the input terminal, i.e. the "1" level, of the voltage sensing circuit will inevitably be detected erroneously as the "0" level, and the EPROM will operate erroneously. Consequently the EPROM will read out wrong data until the input terminal of the voltage sensing circuit is charged to the "1" level.

To avoid the above-mentioned unstable operation of a memory device, the column lines may be charged to the "1" level or a similar level as long as they are not selected. This method can indeed lessen the above-mentioned problems, but cannot be applied to, for example an EPROM which comprises MIS transistors having charge trapping centers. If the column lines of an EPROM are charged to the "1" level or a similar level, electrons will be injected erroneously into the charge trapping centers. This will render the EPROM alarmingly unreliable.

OBJECT AND SUMMARY OF THE INVENTION

An object of this invention is to provide a memory device which comprises a integrated circuit of MOS FETs and which can be accessed without a delay and operates in a stable condition.

A memory device according to this invention comprises: a plurality of row lines; a row decoder for selecting any one of the row lines; a plurality of column lines; a column decoder for selecting any one of the column lines; a plurality of memory cells connected to the row and column lines in such a manner that each receives an input signal through the corresponding row line and supplies an output signal through the corresponding column line; a first potential source connected to the column lines through a load element for supplying a reference voltage potential; and means for preventing the column lines from having a voltage potential of the polarity opposite to that of the voltage potential of said first potential source.

The nature of this invention, as well as other objects and advantages thereof, will be readily apparent from consideration of the following specification relating to the annexed drawings, in which like reference characters designate the same parts throughout the figures thereof and wherein:

DESCRIPTION OF PREFERRED EMBODIMENTS

Now referring to the accompanying drawings, embodiments of this invention will be described.

Figure 2:
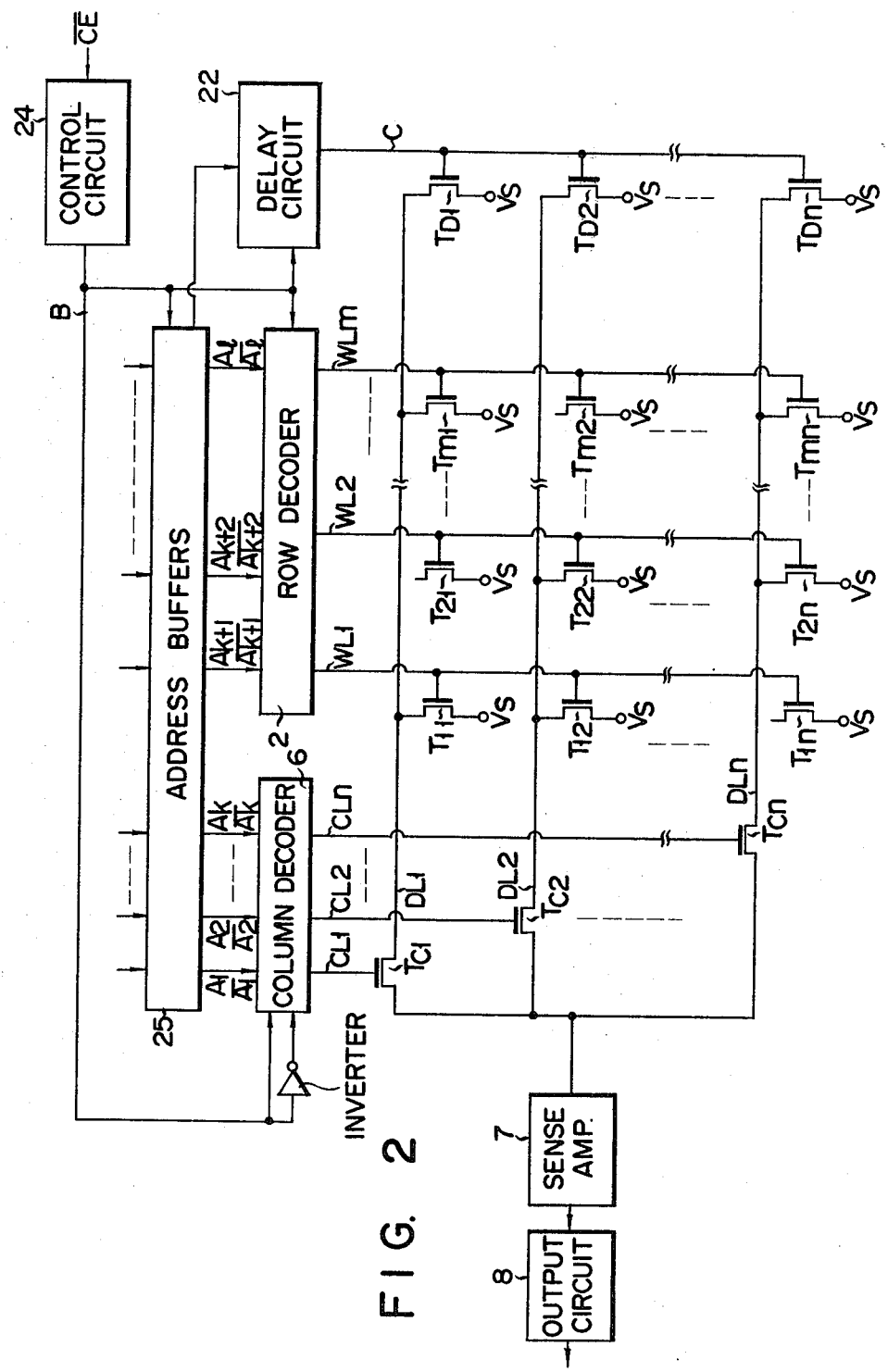
FIG. 2 is a circuit diagram of a static read only memory (mask ROM), a typical embodiment of this invention.

FIG. 2 shows are integrated circuit which constitutes, with other elements, a mask ROM according to this invention. Like each integrated circuit of the aforementioned known mask ROM, the integrated circuit shown in FIG. 2 includes memory cells, i.e. transistors $T_{11}$ to $T_{mn}$ arranged in rows and columns, row lines WL1, WL2,-WLm each connecting the gates of the transistors constituting one row, column lines DL1, DL2,-DLn each connecting the drains of the transistors constituting one column, a row decoder 2 for selecting any one of the row lines, and a column decoder 6 for selecting any one of the column lines. Each memory cell is driven by voltage supplied the row line to which it is connected. Of the memory cells, those which have their drains connected to the column lines DL1, DL2,-DLn store a binary value "0". The other memory cells, i.e. transistors $T_{1n}$, $T_{21}$ and $T_{m2}$, which have their drains not connected to the column lines DL1, DL2,-or DLn store a binary value "1". All these memory cells have their sources connected to a second voltage source Vs, i.e. ground. The column lines DL1, DL2,-DLn include column-selecting transistors $T_{C1}$, $T_{C2}$,-$T_{Cn}$, respectively. The gates of these transistors are connected to the column decoder 6. The column decoder 6 selects and drives any one of the transistors $T_{C1}$, $T_{C2}$,-$T_{Cn}$. As in the aforementioned known mask ROM, there is provided a voltage sensing amplifier 7 for detecting which binary value, "0" or "1", the column line selected by the column decoder 6 produces. The amplifier 7 delivers through an output circuit 8 an output (readout) signal which represents which binary value has been produced by the column line selected. All the MOS transistors used in the mask ROM of FIG. 2 are of N-channel enhancement type. Power source voltage Vc (FIG. 5) is higher than the ground voltage Vs.

The mask ROM of FIG. 2 differs from the known mask ROM in the following respects.

FIRST, the mask ROM further comprises transistors $T_{D1}$, $T_{D2}$,-$T_{Dn}$ of, for example, N-channel type. The transistors $T_{D1}$, $T_{D2}$,-$T_{Dn}$ have their drains connected to the column lines DL1, DL2,-DLn, respectively, so as to hold the column lines at a voltage much the same as the ground voltage Vs for the period during which the semiconductor chip is deselected and for an initial portion of the period during which the chip is selected.

Secondly, the mask ROM further comprises a delay circuit 22. The output terminal C of the circuit 22 is connected to the gates of the transistors $T_{D1}$, $T_{D2}$,-$T_{Dn}$, whose sources are connected to the second voltage source Vs, i.e. ground.

Figure 3:
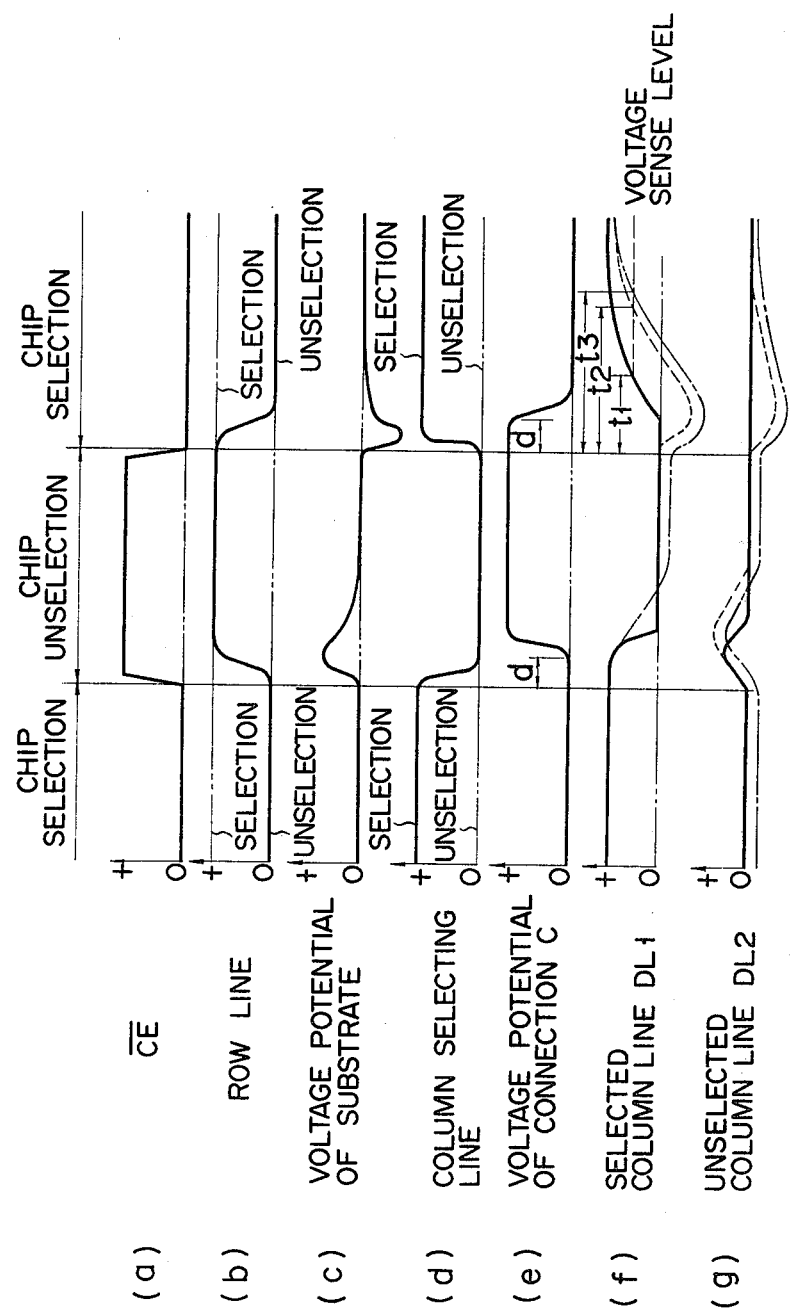
FIG. 3, including a-g, shows timing wave forms which illustrate how the memory device of FIG. 2 operates.

Thirdly, the mask ROM further includes a control circuit 24 which is constituted by a logic circuit and which generates a chip selection signal and a chip deselection signal. In response to a chip enable signal $\overline{CE}$ having such a wave form as shown in FIG. 3(a), the control circuit 24 drives all the row lines WL1, WL2,-WLm and, at the same time, supplies an output to the delay circuit 22 to cause the same to produce an output signal which has such a wave form as shown in FIG. 3(e) and which continues for the period during which chip is not selected and the initial portion of the period during which a chip is selected. Alternatively, the row lines may be driven by supplying the output signal of the control circuit 24 to the row decoder 2 through address buffers 25.

Now it will be described how the mask ROM of FIG. 2 operates. The chip of the mask ROM is selected as long as the chip enable signal $\overline{CE}$ has "0" level and is not selected as long as the signal $\overline{CE}$ has "1" level. Suppose the row line WL2 and the column line DL1 are selected when the signal $\overline{CE}$ has "0" level. Then, the column line DL1 comes to have "1" level because the transistor $T_{21}$ is not rendered conductive. The other row lines WL1, WL3,-WLm and the other column lines DL2 to DLn are not selected and are held at substantially the ground voltage Vs. The output of the delay circuit 22 therefore has a level substantially equal to the ground voltage Vs as illustrated in FIG. 3(e). Thus, the transistors $T_{D1}, T_{D2},-T_{Dn}$ remain nonconductive. As a result, the data reading is carried out without troubles.

Figure 1:
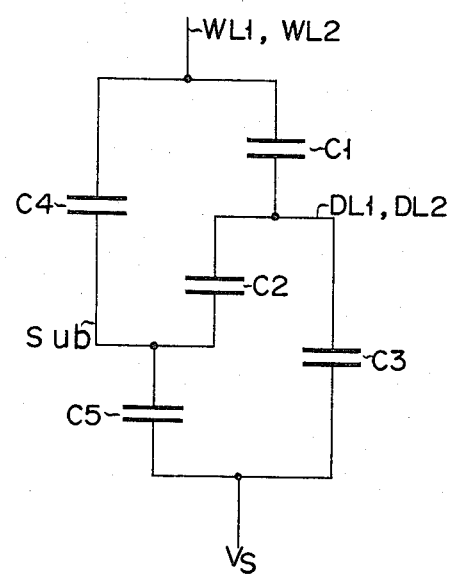
FIG. 1 shows how coupling capacitances are arranged in the cell array of a typical type of a static read only memory (e.g. mask ROM)

When the chip enable signal $\overline{CE}$ comes to have "1" level, the control circuit 24 supplies an output signal to the address buffers 25, row decoder 2 and the delay circuit 22. Consequently, all the row lines WL1, WL2,-WLm are selected and come to have "1" level. Upon lapse of the delay time d of the delay circuit 22, the output level of the delay circuit 22 rises to "1" level, whereby the transistors $T_{D1}, T_{D2},-T_{Dn}$ are made conductive. Then all the column lines DL1, DL2,-DLn will be held at the ground voltage Vs. When all the row lines WL1, WL2,-WLm are selected, the potential of the substrate Sub changes to a positive potential as shown in FIG. 3(c) since coupling capacitances are provided between the substrate Sub and the row lines as illustrated in FIG. 1. Eventually, however, the potential of the substrate Sub returns to a level much the same as the ground voltage Vs. More specifically, since the substrate has a resistance of about 10 ohms to about several hundred ohms with respect to the ground and, in addition, a contact resistance which comes into existence once the semiconductor chip has been assembled into a package, it returns to said level with a time constant which is determined by these resistances and the substrate-ground capacitance. An unselected column line, for example the column line DL2, has its potential changed to a positive level as the potential of the substrate Sub rises, as illustrated in FIG. 3(g). But its potential drops to the ground voltage Vs as soon as the transistor $T_{D2}$ is rendered conductive.

When the chip enable signal $\overline{CE}$ comes to have "0" level again, all the row lines but the selected one, e.g. WL2, are discharge. As a result, the selected transistor $T_{C1}$ is rendered conductive, and the potential of the output terminal C of the delay circuit 22 drops to "0" level upon lapse of delay time d of the circuit 22. This delay time d is determined according to the time during which the discharge of non-selected row lines ceases to exert influence and the time which is necessary to discharge or charge the non-selected column lines. The potential Vsub of the substrate Sub is changed to a negative potential by the coupling capacitances and returns to the ground voltage Vs with aforementioned time constant.

The transistors $T_{D1}, T_{D2},-T_{Dn}$ play an important role. Without them, the potential of every column line would be changed to a negative potential by the coupling capacitances between the substrate Sub and the row lines. The non-selected column-selecting transistors as well as the selected column-selecting transistor $T_{C1}$ would be rendered conductive. All the column lines should thus be charged until every non-selected column-selecting transistors is cut off. This would extremely reduce the data-reading speed as illustrated in FIGS. 3(f) and 3(g) by dotted lines. That is, it would take a long time $t_2$ until the potential of the selected column line DL1 reaches the voltage sense level of the voltage sensing amplifier 7. Provided with the transistors $T_{D1}, T_{D2},-T_{Dn}$, the memory device of FIG. 2 can read data at a high speed. More specifically, as indicated by solid lines in FIGS. 3(f) and 3(g), the transistors $T_{D1}, T_{D2},-T_{Dn}$ hold all the column lines DL1, DL2,-DLn at the ground voltage Vs as long as all the row lines exert influence. It is therefore sufficient to charge only the elected column line DL1 after the potential of the output terminal C has dropped to "0" level and the transistors $T_{D1}, T_{D2},-T_{Dn}$ have become non-conductive. Thus, it takes only a short time $t_1$ until the potential of the selected column line DL1 reaches the voltage sense level of the voltage sensing amplifier 7, as shown in FIG. 3(f). The data-reading speed is therefore sufficiently high.

Figure 4:
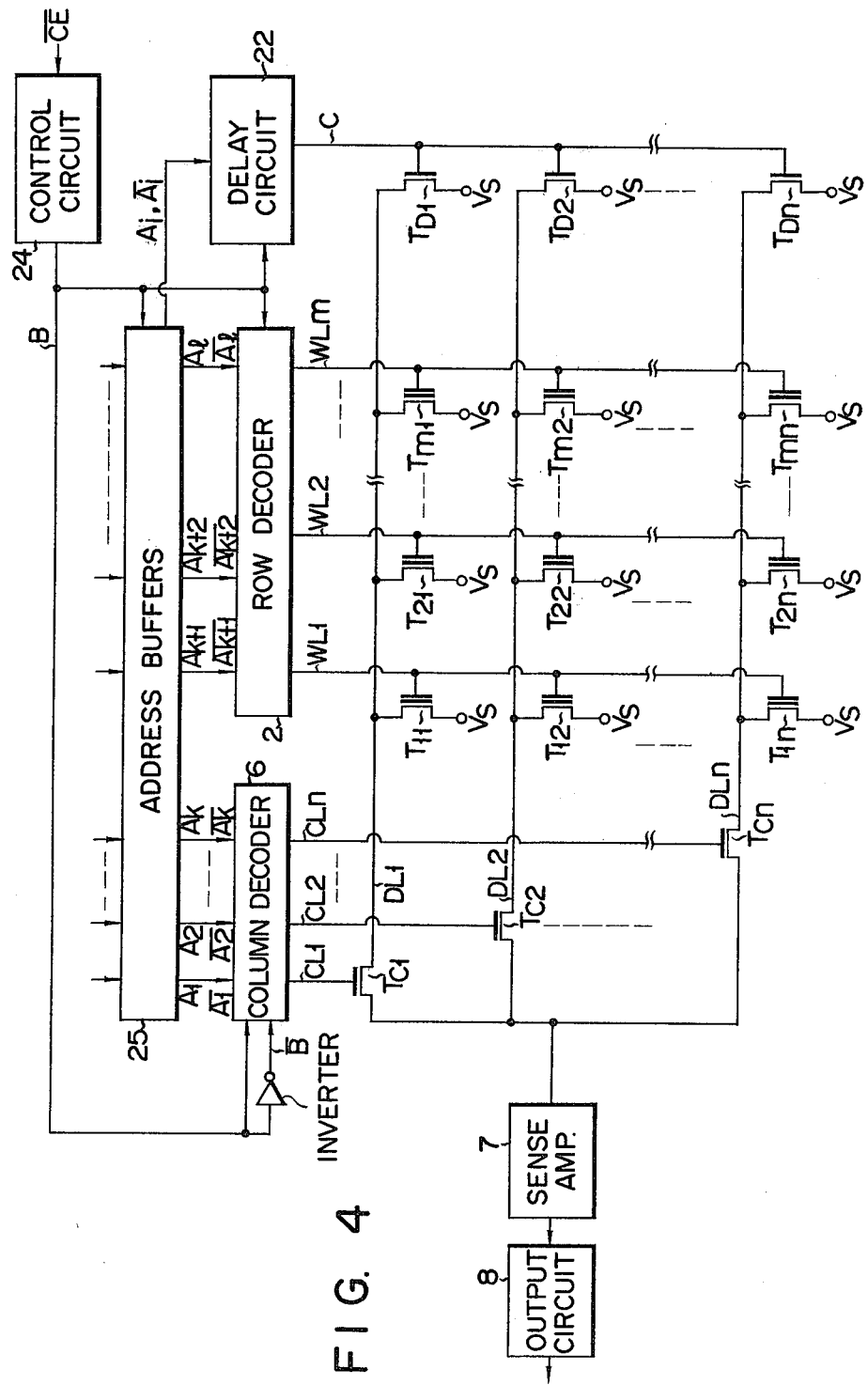
FIG. 4 is a circuit diagram of an EPROM, another embodiment of this invention.

FIG. 4 shows a circuit which constitute, with other elements, an EPROM. In the EPROM, the semiconductor chip is exposed to external light. The EPROM of FIG. 4 is identical with the mask ROM of FIG. 2 with respect to structure, except that transistors $T_{11}, T_{12},-T_{mn}$ are SAMOSs disclosed in the U.S. Pat. No. 3,984,822. The construction of the EPROM is not therefore described here.

The column lines of the EPROM, which are electrically floating, have their potential reduced by about 0.5 V due to the electromotive force generated in the PN junctions by the external light. How much their potential drops depends on the intensity of the external light. Usually it is reduced by approximately the forward potential of the PN junctions. If the transistors $T_{D1}, T_{D2}, \ldots T_{Dn}$ were not provided, the column line DL1 would be charged with its initial negative potential set at a level lower than in case the semiconductor chip is not exposed to external light. As a result, the data-reading speed would become much lower as illustrated in FIGS. 3(f) and 3(g) by chain lines. That is, it would take a long time $t_3$ until the selected column line DL1 reaches the voltage sense level of the voltage sensing amplifier 7, as shown in FIG. 3(f). The transistors $T_{D1}, T_{D2}, \ldots T_{Dn}$ hold the column lines DL1, DL2, ... DLn at the ground voltage Vs as long as the semiconductor chip remains unselected and as long as the delay time d of the delay circuit 22 lasts. During these periods electrons cannot easily enter the trapping centers of each transistor even if noise is generated. The EPROM therefore possesses a high reliability.

In FIGS. 2 and 4 the row decoder 2, the column decoder 6, the voltage sensing amplifier 7, the delay circuit 22 and the address buffers 25 are illustrated in the form of blocks. Now the structure of each of these devices will be described with reference to FIGS. 5 to 9.

Figure 5:
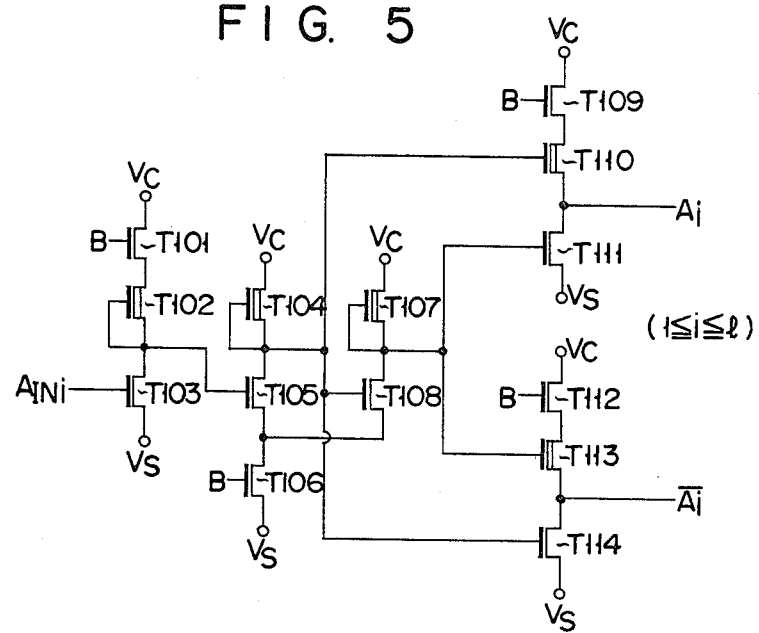
FIG. 5 is a circuit diagram of an address buffer circuit used in the memory device of FIG. 2.

As shown in FIG. 5, each address buffer 25 may comprise depletion type transistors (hereinafter called "D-type transistors") T102, T104, T107, T110 and T113, enhancement type transistors (hereinafter called "E-type transistors") T103, T105, T106, T108, T111 and T114 and intrinsic transistors (hereinafter called "I-type transistors") T101, T109 and T112. The I-type transistors T101, T109 and T112 have a threshold voltage Vth of about 0 V (e.g. $-0.3 \text{ V} \lesssim \text{Vth} \lesssim 0.3 \text{ V}$). Signals B are supplied to the I-type transistors T101, T109 and T112. When a signal B of "0" level is supplied to them, all the current paths between Vc terminal and Vs terminal are cut. Consequently, both outputs Ai and $\overline{Ai}$ of the address buffer 25 come to have "0" level.

Figure 6:
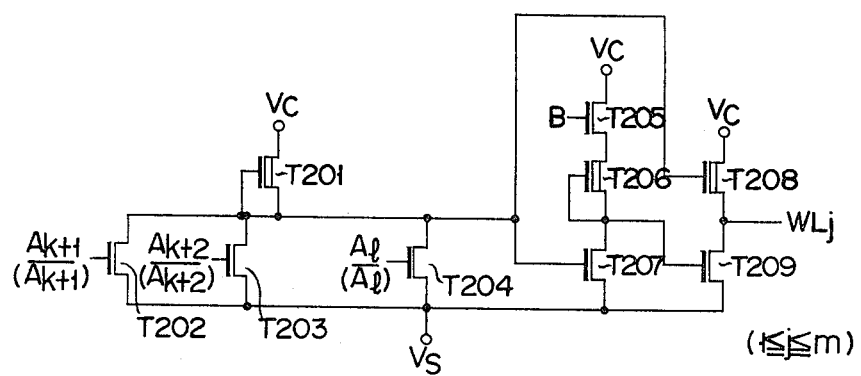
FIG. 6 is a circuit diagram of a row decoder used in the memory device of FIG. 2.

As shown in FIG. 6, the row decoder 2 may comprise D-type transistors T201, T206 and T208, an I-type transistor T205 and E-type transistors T202, T203, T204, T207 and T209. When a signal B of "0" level is supplied to the I-type transistor T205, the outputs $A_{k+1}(\overline{A}_{k+1}), A_{k+2}(\overline{A}_{k+2}), \ldots A_j(\overline{A}_j)$ come to have "0" level, and the row line WLj is charged to "1" level.

Figure 7:
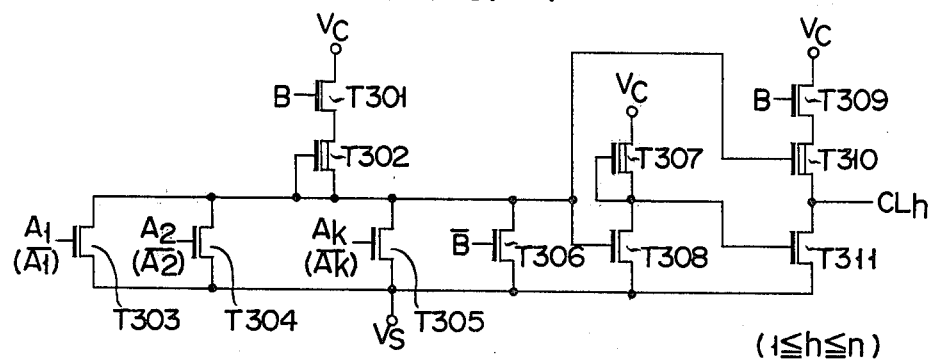
FIG. 7 is a circuit diagram of a column decoder used in the memory device of FIG. 2.

As shown in FIG. 7, the column decoder 6 may comprise D-type transistors T302, T307 and T310, I-type transistors T301 and T309 and E-type transistors T303, T304, T305, T306, T308 and T311. When signals B of "0" level are supplied to the I-type transistors T301 and T309 and a signal $\overline{B}$ of "1" level is supplied to the E-type transistor T306, the outputs $A_1(\overline{A}_1)$, $A_2(\overline{A}_2)$, ... $A_k(\overline{A}_k)$ come to have "0" level, whereby the column selecting line $CL_h$ is discharged to "0" level.

Figure 8:
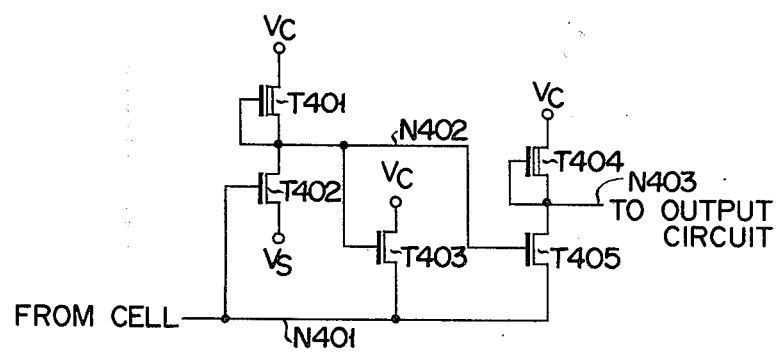
FIG. 8 is a circuit diagram of a sense amplifier used in the memory device of FIG. 2.

As shown in FIG. 8, the voltage sensing amplifier 7 may comprise D-type transistors T401 and T404 and E-type transistors T402, T403 and T405. The output terminal N401 of a column line connected to a memory cell is coupled to the input of an inverter which is constituted by the transistors T401 and T402. The output N402 of the inverter is fed back to the gates of the load transistor T403 and the transfer gate T405. The "0" and "1" levels of a node N401 is kept within a range of 1.5 V to 2.0 V, and the "0" and "1" levels of an output node N403 is elevated to Vc (5 V) to 1.5 V.

Figure 9:
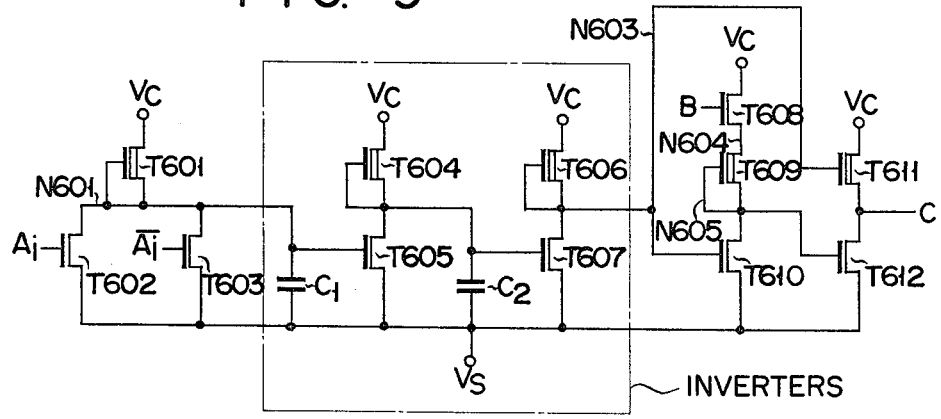
FIG. 9 is a circuit diagram of a delay circuit used in the memory device of FIG. 2.

As shown in FIG. 9, the delay circuit 22 may comprise D-type transistors T601, T604, T606, T609 and T611, an I-type transistor T608 and E-type transistors T602, T603, T605, T607, T610 and T612. The transistors T604, T605, T606 and T607 constitute inverters. The inverter and the capacitors $C_1$ and $C_2$ constitute the main part of the delay circuit 22. When a signal B of "0" level is supplied to the I-type transistor T608, both address outputs Ai and $\overline{Ai}$ come to have "0" level. When a signal B of "1" level is supplied to the transistor T608, either the address output Ai or $\overline{Ai}$ come to have "1" level, and a node N601 comes to have "0" level. As a result, the inverter will operate to lower the potential of an output C to "0" level with a predetermined delay time. The delay time, i.e. the time which lapse between the selection of a row line WLj and the production of an output C is determined by the inverters and the capacitors $C_1$ and $C_2$.

Figure 10:
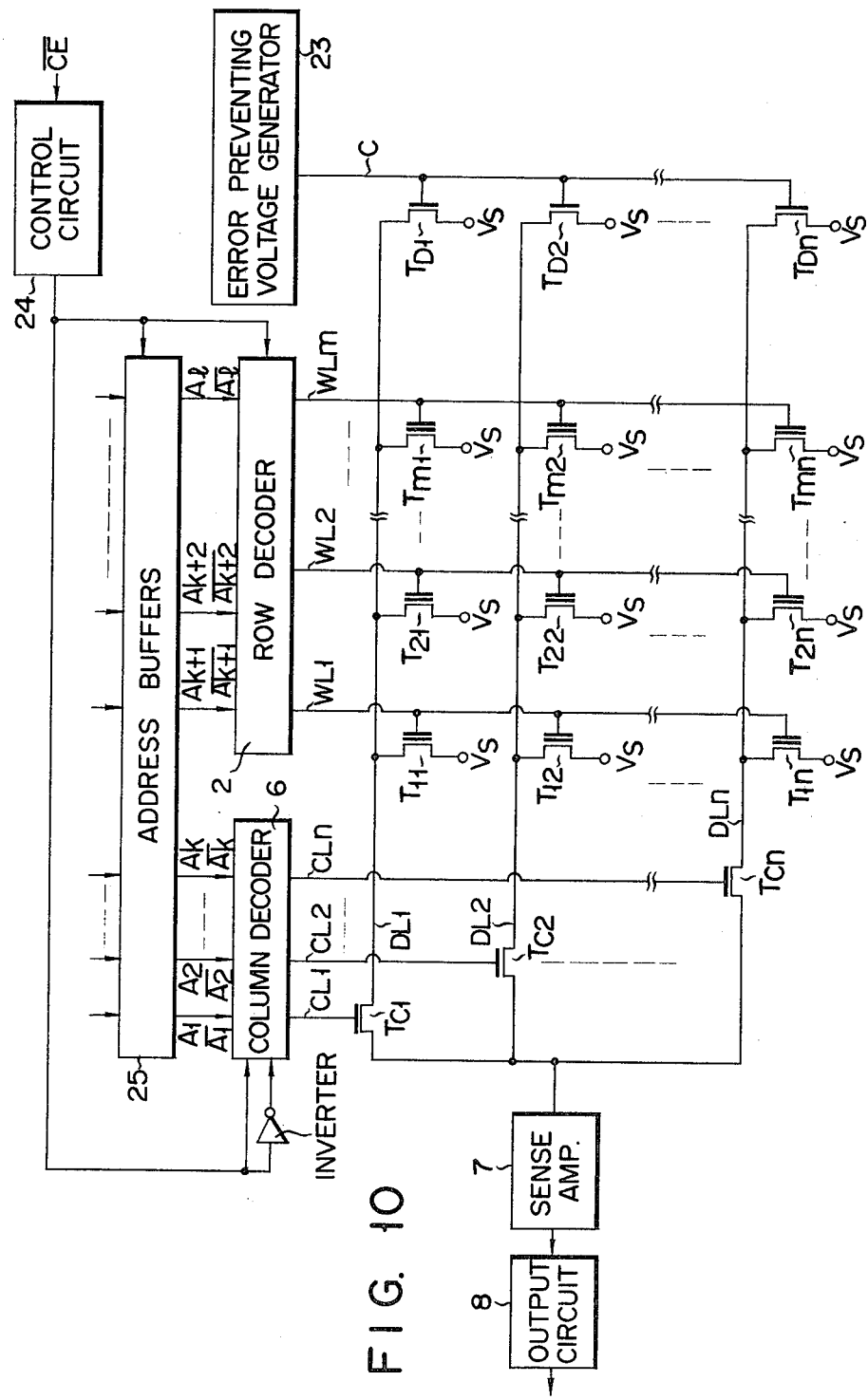
FIG. 10 is a circuit diagram of a modification of the EPROM shown in FIG. 4.

Now referring to FIG. 10, another embodiment of this invention will be described. This embodiment is a modification of the EPROM shown in FIG. 4 and is identical in structure with the EPROM of FIG. 4 except for the following points. First, in order to hold column lines DL1, DL2, ... DLn at about the ground voltage Vs while they are electrically floating, N-channel transistors $T_{D1}$, $T_{D2}$, ... $T_{Dn}$ have their drains connected respectively to the column lines DL1, DL2, ... DLn. Secondly, an error preventing voltage generator 23 is provided in place of a delay circuit. The output terminal C of the voltage generator 23 is connected to the gates of the transistors $T_{D1}$, $T_{D2}$, ... $T_{Dn}$. The transistors $T_{D1}$, $T_{D2}$, ... $T_{Dn}$ have their sources connected to a voltage source Vs, i.e. ground. As shown in FIG. 11(B), the error preventing voltage generator 23 comprisies a depletion N-type transistor T706 and an enhancement N-type transistor T707 which constitute a series circuit connected between a voltage source Vc and the ground Vs. The transistor T706 has its gate connected to its own source, and the transistor T707 has its gate connected to its own drain, i.e. output terminal C. The transistors $T_{D1}$, $T_{D2}$, ... $T_{Dn}$ and the transistors T706 and T707 have been fabricated at the same step of manufacture of an integrated circuit and have the same characteristics. The output terminal C of the voltage generator 23 has a potential which is a little higher than the threshold voltage of the transistor T707.

The EPROM of FIG. 10 operates in the following manner. Even if a column line, for example the column line DL1, is electrically floating and comes to have a negative potential, the ground voltage Vs will quickly be applied to the column line DL1 to change the same to a level substantially equal to the ground voltage Vs. This is because the transistor $T_{D1}$ is rendered conductive as soon as the column line DL1 comes to have a negative potential. This operation is achieved whenever the potential of the column line DL1 drops to a negative value for any of such reasons as stated above in connection with the mask ROM of FIG. 2. Thus, any column line is charged always with its initial potential already elevated to about the ground voltage Vs. The time during which each memory cell is accessed can therefore be shorted. Further it becomes possible to prevent an error that binary value "1" appearing in a selected column line would change to binary value "0". Right after it has worked to charge the column line DL1 to a level substantially equal to the ground voltage Vs, the transistor $T_{D1}$ is rendered non-conductive and will not affect the circuit operation.

Figure 11A:
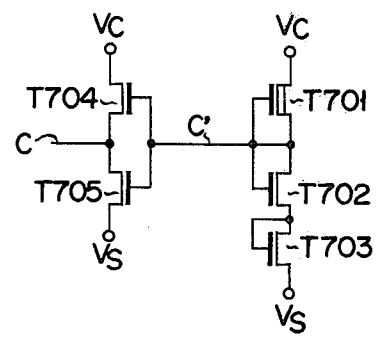
FIGS. 11(A) and 11(B) are circuit diagram of an error preventing voltage generator used in the EPROM of FIG. 10.
Figure 11B:
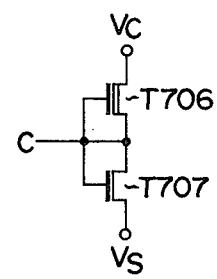

FIG. 11(A) is a circuit diagram of a voltage generator more practical than that shown in FIG. 11(B). This voltage generator differs in that the potential of its output i.e. drive voltage of the transistors $T_{D1}$, $T_{D2}$, ... $T_{Dn}$ is lower than the threshold voltage Vth of these transistors. The transistors constituting the voltage generator have been fabricated simultaneously with the transistors $T_{D1}$, $T_{D2}$, ... $T_{Dn}$ and have the same characteristics. Transistors T703 and T702 provide a terminal C' with a potential of 2 Vth, and an output terminal C of the voltage generator may have a potential of Vth. In fact, however, the potential of the output terminal C is lower than Vth because there is provided a transistor T705. Both transistors T702 and T705 are N-channel enhancement transistors. Further provided is a transistor T701 which is an N-channel depletion transistor.

Figure 12:
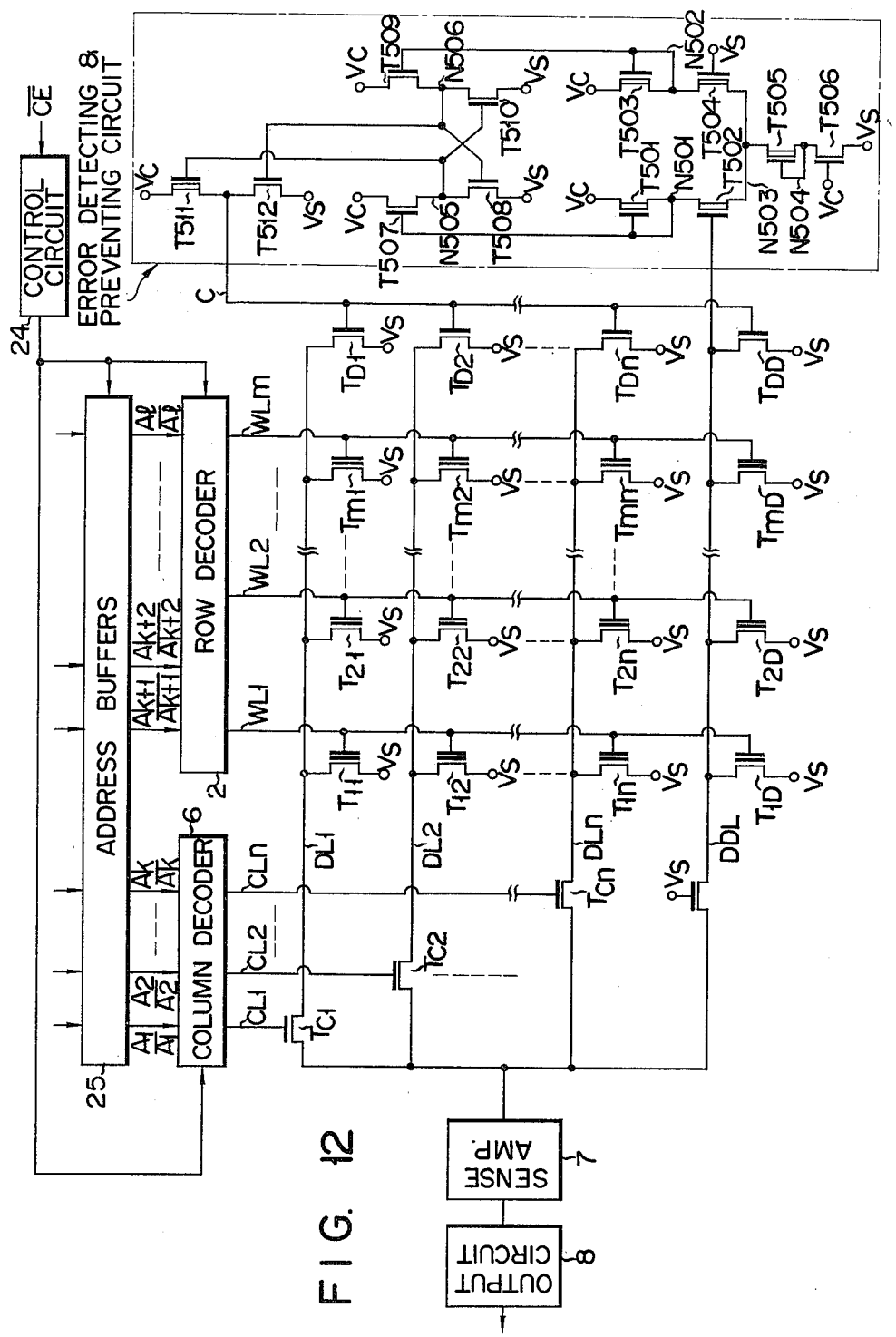
FIG. 12 is a circuit diagram of another modification of the EPROM shown in FIG. 4.

FIG. 12 shows still another modification of the EPROM shown in FIG. 4. This EPROM differs from that of FIG. 4 in that it has an error detecting/preventing circuit. The error detecting/preventing circuit detects an error appearing on a column line, due to a negative potential at which the column line is held. Upon detecting such an error, the circuit applies "1" level to the gates of transistors $T_{D1}$, $T_{D2}$, ... $T_{Dn}$, thus charging the column line to a level substantially equal to the ground voltage Vs. Th EPROM of FIG. 12 further differs in that it is provided with a dummy column line DDL and dummy memory cells, i.e. transistors $T_{1D}$ to $T_{DD}$ connected to the dummy column line DDL. The dummy column line DDL is so connected that an error may occur in it just as in column lines DL1, DL2, ... DLn. The output of the dummy column line DDL is detected by an error detecting circuit, e.g. a differential amplifier constituted by transistors T501 to T506. It is then amplified by a flip-flop circuit constituted by transistors T507 to T510 and a buffer constituted by transistors T511 and T512, thereby providing an output signal C of the error detecting/preventing circuit. The output signal C thus obtained is supplied to the gates of the transistors $T_{D1}$, $T_{D2}$, ... $T_{Dn}$ which discharge the column lines DL1, DL2, ... DLn and to the gate of the transistor $T_{DD}$ which discharges the dummy column line DDL. The transistors T501 to T505 and T511 are D-type ones, the transistors T507 and T509 are I-type ones, and the other transistors of the error detecting/preventing circuit are E-type ones.

Now it will be described how the error detecting/preventing circuit operates. As long as the dummy column line DDL is held at a potential of −0.3 V to 0 V, the outputs N501 and N502 of the differential amplifier have "0" level and "1" level, respectively, the outputs N505 and N506 of the flip-flop circuit have "0" level and "1" level, respectively, and the output C of the buffer has "0" level. When the dummy column line DDL, for example, has its potential changed to a negative potential of, for instance, less than −0.3 V, it is detected by the differential amplifier. The outputs N501 and N502 of the differential amplifier comes to have "1" level and "0" level, respectively, and the outputs N505 and N506 of the flip-flop circuit come to have "1" level and "0" level, respectively, and the output C of the buffer come to have "1" level. As a result, the transistors $T_{D1}$, $T_{D2}$, ... $T_{Dn}$ are rendered conductive, whereby the column lines DL1, DL2, ... DLn and the dummy column line DDL come to have a potential substantially equal to 0 V, i.e. the ground voltage Vs. This change of potential is detected again by the differential amplifier. Consequently, the outputs N501 and N502 of the differential amplifier come to have "0" level and "1" level, respectively, and the outputs N505 and N506 of the flip-flop circuit come to have "0" level and "1" level, respectively, and the output C of the buffer comes to have "0" level. In this way an error is automatically prevented.

The EPROM of FIG. 12 has a column decoder 6 which is identical with the row decoder shown in FIG. 6. When the column lines are not selected, the column-selecting lines CL1, CL2, ... CLn come to have "1" level. Instead, the column decoder 6 may be constituted by the column decoder shown in FIG. 7. Similarly, the row decoder 2 of the EPROM of FIG. 12 may be constituted either by the row decoder shown in FIG. 6 or the column decoder shown in FIG. 7.

Figure 13:
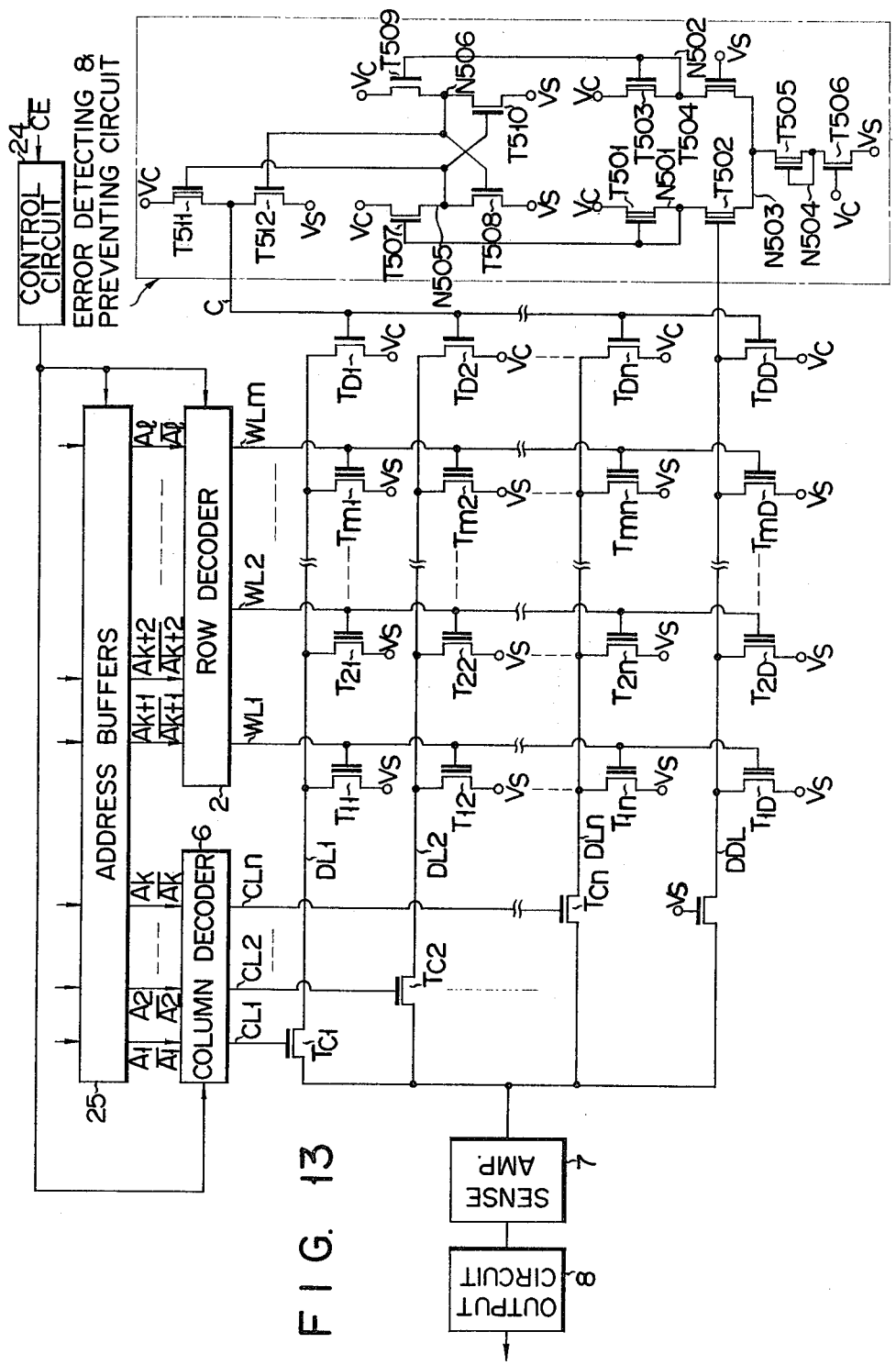
FIG. 13 is a circuit diagram of a modification of the EPROM shown in FIG. 12.

FIG. 13 shows another modification of the EPROM shown in FIG. 4. This EPROM is identical with that of FIG. 12 except that the sources of transistors $T_{D1}$, $T_{D2}$, ... $T_{Dn}$ and $T_{DD}$ are connected to Vc terminal. That is, the column lines are charged with their initial held at Vc. With the EPROM of FIG. 13 it is necessary to use a feedback system which operates at a sufficiently high speed. Otherwise, the output signal C of an error detecting/preventing circuit would have "1" level, and the column lines would be charged to much and have an excessively high potential by the time the signal C drops to "0" level after an error has been eliminated. In this embodiment a dummy column line is provided to detect a negative potential. The dummy column line may be omitted. If it is omitted, the negative potential of one of the column lines is detected.

Figure 14:
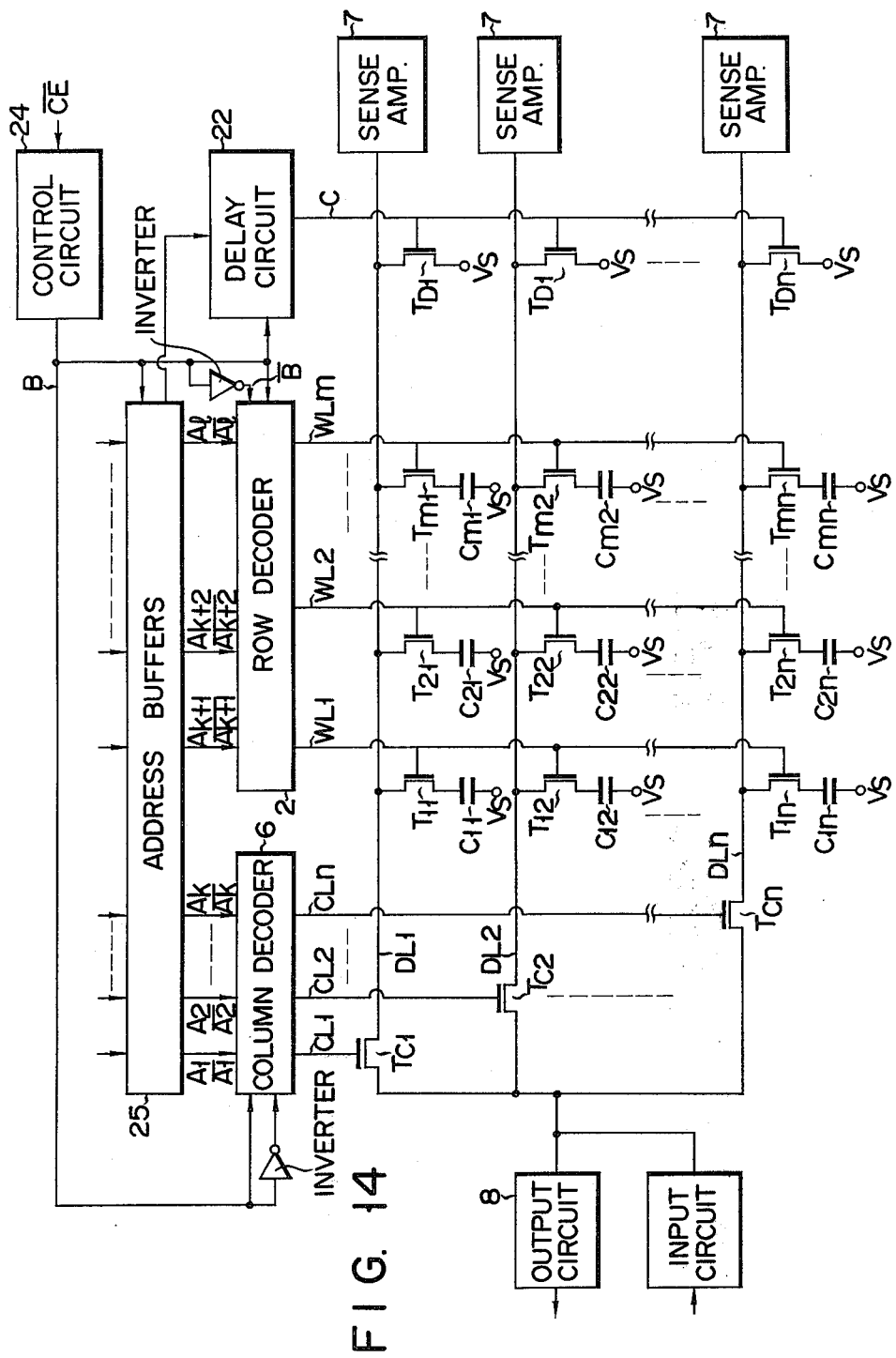
FIG. 14 is a circuit diagram of a d-RAM (dynamic-random access memory) according to this invention.

FIG. 14 shows a d-RAM according to this invention. Each memory cell of the d-RAM is comprised of one transistor and one capacitor. Besides this point, the d-RAM differs in structure from the EPROM of FIG. 4 only in that every column line is provided with a voltage sensing amplifier and that a row decoder is identical with the column decoder shown in FIG. 7. Further, all the row lines WL1, WL2, ... WLm are held at "0" level as long as all the row lines are not selected, so that the data in the memory cells may not be erased.

This invention is not limited to the above-described embodiments. For example, the P-channel MOS transistors may be used instead of N-channel MOS transistors used in the above-mentioned embodiments. Further, this invention may be applied not only to static ROMs but also to dynamic ROMs.

What we claim is:

1. A memory device utilizing metal oxide semiconductor field effect ransistors (MOS FETs) formed in an electrically selectable semiconductor chip, comprising:
    a plurality of row lines through which input signals are supplied;
    a row decoder for selecting any one of said row lines;
    a plurality of column lines through which output signals are supplied;
    a column decoder for selecting any one of said column lines;
    a plurality of memory cells connected to said row and column lines in such a manner that each receives an input signal through the row line to which it is connected and supplies an output signal through the column line to which it is connected;
    a signal sensing circuit connected to said column lines for detecting an output signal supplied thereon and for supplying an output circuit with a readout signal in response thereto;
    a first potential source connected to said column lines through a load element for supplying said column lines with a reference voltage potential;
    a second potential source connected to said memory cells for supplying said memory cells with a second potential source voltage; and
    means for holding said column lines at a potential substantially equal to the voltage supplied from said second potential source, for the period during which said semiconductor chip is not in a selected state and for an initial portion of the period during which said semiconductor chip is in a selected state.

2. A memory device utilizing metal oxide semiconductor field effect transistors (MOS FETs) formed in an electrically selectable semiconductor chip, comprising:
    a plurality of row lines through which input signals are supplied;
    a row decoder for selecting any one of said row lines;
    a plurality of column lines through which output signals are supplied;
    a column decoder for selecting any one of said column lines;
    a plurality of memory cells connected to said row and column lines in such a manner that each receives an input signal through the row line to which it is connected and supplies an output signal through the column line to which it is connected;
    a signal sensing circuit connected to said column lines for detecting an output signal supplied thereon and for supplying to an output circuit a readout signal in response thereto;
    a first potential source connected to said column lines through a load element for supplying said column lines with a reference voltage potential;
    a second potential source connected to said memory cells for supply said memory cells with a second potential source voltage; and
    means for holding said column lines at a potential substantially equal to the voltage supplied from said second potential source, thereby to prevent said column lines from having a potential of the opposite polarity to the voltage supplied from said first voltage source, for the period during which said semiconductor chip is not in a selected state and for an initial portion of the period during which said semiconductor chip is in a selected state.

3. A memory device according to claim 1 or 2, further comprising a chip selection/deselection signal generating circuit having an output terminal and wherein said means for holding comprises a delay circuit connected to said output terminal for control by a chip selection signal, and a plurality of MOS FETs whose gate electrodes are connected to said delay circuit output terminal, whose source electrodes are connected said second potential source, and whose drain electrodes are connected respectively to said column lines.

4. A memory device according to claim 1 or 2, further comprising a chip selection/deselection signal generating circuit having an output terminal and wherein said means for holding comprises a delay circuit connected to said output terminal for control by a chip selection signal, and a plurality of MOS FETs whose gate electrodes are connected to said delay circuit output terminal, whose drain electrodes are connected to said second potential source, and whose source electrodes are connected respectively to said column lines.

5. A memory device utilizing metal oxide semiconductor field effect transistors (MOS FETs) formed in a semiconductor substrate, comprising:
a plurality of row lines through which input signals are supplied;
a row decoder for selecting any one of said row lines; wherein said means for holding comprising:
a plurality of row lines through which input signals are supplied;
a row decoder for selecting any one of said row lines;
a plurality of column lines through which output signals are supplied;
a column decoder for selecting any one of said column lines;
a plurality of memory cells connected to said row and column lines in such a manner that each receives an input signal through the row line to which it is connected and supplies an output signal through the column line to which it is connected;
a signal sensing circuit connected to said column lines for detecting an output signal supplied thereon and for supplying an output circuit with a readout signal in response thereto;
a first potential source connected to said column lines through a load element for supplying said column lines with a reference voltage potential;
a second potential source connected to said memory cells for supplying said memory cells with a second potential source voltage; and
means for preventing said column lines from having a voltage potential of the polarity opposite to that of the voltage potential of said first potential source; wherein said means for preventing comprises a plurality of MOS FETs which are arranged in said column lines and connected at one end respectively to the corresponding column line and at another end to said second potential source; a first voltage supplying circuit including a load element connected between said first potential source and a first output terminal, and n MOS FETs connected in series between said first output terminal and said second potential source, where n denotes an integral number; and a second voltage supplying circuit including (n−1) MOS FETs connected between said first potential source and a second output terminal, and a MOS FET connected between said second output terminal and said second potential source, all the MOS FETs of said second voltage supplying circuit having their gate electrodes supplied with an output signal delivered from said first output terminal and said second output terminal being connected to the gates of said plurality of MOS FETs arranged in said column lines.

6. A memory device utilizing metal oxide semiconductor field effect transistors (MOS FETs) formed in a semiconductor substrate, comprising:
a plurality of row lines through which input signals are supplied;
a row decoder for selecting any one of said row lines;
a plurality of column lines through which output signals are supplied;
a column decoder for selecting any one of said column lines;
a plurality of memory cells connected to said row and column lines in such a manner that each receives an input signal through the row line to which it is connected and supplies an output signal through the column line to which it is connected;
a signal sensing circuit connected to said column lines for detecting an output signal supplied thereon and for supplying an output circuit with a readout signal;
a first potential source connected to said column lines through a load element for supplying said column lines with a reference voltage potential;
a second potential source connected to said memory cells for supplying said memory cells with a second potential source voltage;
a plurality of MOS FETs whose source electrodes are connected to said second potential source and whose drain electrodes are connected respectively to said column lines;
and
an error detecting and preventing circuit for detecting the potential of said column lines, for supplying a signal to the gate electrodes of said MOS FETs when the potential of said column lines becomes a potential opposite to that of said first potential source, thereby rendering said MOS FETs conductive and connecting said column lines to said second potential source, and for rendering said MOS FETs nonconductive when the potential of said column lines becomes substantially equal to the voltage supplied from said second potential source.

7. A memory device utilizing metal oxide semiconductor field effect transistors (MOS FETs) formed in a semiconductor substrate, comprising:
a plurality of row lines through which input signals are supplied;
a row decoder for selecting any one of said row lines;
a plurality of column lines through which output signals are supplied;
a column decoder for selecting any one of said column lines;
a plurality of memory cells connected to said row and column lines in such a manner that each receives an input signal through the row line to which it is connected and supplies an output signal through the column line to which it is connected;
a signal sensing circuit connected to said column lines for detecting an output signal supplied thereon and for supplying an output circuit with a readout signal;
a first potential source connected to said column lines through a load element for supplying said column lines with a reference voltage potential;

a second potential source connected to said memory cells for supplying said memory cells with a second potential source voltage;

a plurality of MOS FETs whose drain electrodes are connected to said second potential source and whose source electrodes are connected respectively to said column lines; and an error detecting and preventing circuit for detecting the potential of said column lines, for supplying a signal to the gate electrodes of said MOS FETs when the potential of said column lines becomes a potential opposite to that of said first potential source, thereby rendering said MOS FETs conductive and connecting said column lines to said second potential source, and for rendering said MOS FETs nonconductive when the potential of said column lines becomes substantially equal to the voltage supplied from said second potential source.

8. A memory device utilizing metal oxide semiconductor field effect transistors (MOS FETs) formed in a semiconductor substrate, comprising:

a plurality of row lines through which input signals are supplied;

a row decoder for selecting any one of said row lines;

a plurality of column lines through which output signals are supplied;

a column decoder for selecting any one of said column lines;

a plurality of memory cells connected to said row and column lines in such a manner that each receives an input signal through the row line to which it is connected and supplies an output signal through the column line to which it is connected;

a signal sensing circuit connected to said column lines for detecting an output signal supplied thereon and for supplying an output circuit with a readout signal;

a first potential source connected to said column lines through a load element for supplying said column lines with a reference voltage potential;

a second potential source connected to said memory cells for supplying said memory cells with a second potential source voltage;

a plurality of MOS FETs whose drain electrodes are connected to said second potential source and whose source electrodes are connected respectively to said column lines; and an error detecting and preventing circuit for detecting the potential of said column lines, for supplying a signal to the gate electrodes of said MOS FETs when the potential of said column lines becomes a potential opposite to that of said first potential source, thereby rendering said MOS FETs conductive and connecting said column lines to said second potential source, and for rendering said MOS FETs nonconductive when the potential of said column lines becomes substantially equal to the voltage supplied from said second potential source.

9. A memory device utilizing metal oxide semiconductor field effect transistors (MOS FETs) formed in a semiconductor substrate, comprising:

a plurality of row lines through which input signals are supplied;

a row decoder for selecting any one of said row lines;

a plurality of column lines through which output signals are supplied;

a column decoder for selecting any one of said column lines;

a plurality of memory cells connected to said row and column lines in such a manner that each receives an input signal through the row line to which it is connected and supplies an output signal through the column line to which it is connected;

a signal sensing circuit connected to said column lines for detecting an output signal supplied thereon and for supplying an output circuit with a readout signal;

a first potential source connected to said column lines through a load element for supplying said column lines with a reference voltage potential;

a second potential source connected to said memory cells for supplying said memory cells with a second potential source voltage;

a plurality of MOS FETs whose drain electrodes are connected to said first potential source and whose source electrodes are connected respectively to said column lines; and an error detecting and preventing circuit for detecting the potential of said column lines, for supplying a signal to the gate electrodes of said MOS FETs when the potential of said column lines becomes a potential opposite to that of said first potential source, thereby rendering said MOS FETs conductive and connecting said column lines to said first potential source, and for rendering said MOS FETs nonconductive when the potential of said column lines becomes substantially equal to the voltage supplied from said first potential source.

10. A memory device utilizing metal oxide semiconductor field effect transistors (MOS FETs) formed in a semiconductor substrate, comprising:

a plurality of row lines through which input signals are supplied;

a row decoder for selecting any one of said row lines;

a plurality of column lines through which output signals are supplied;

a column decoder for selecting any one of said column lines;

a plurality of memory cells connected to said row and column lines in such a manner that each receives an input signal through the row line to which it is connected and supplies an output signal through the column line to which it is connected;

a signal sensing circuit connected to said column lines for detecting an output signal supplied thereon and for supplying an output circuit with a readout signal;

a first potential source connected to said column lines through a load element for supplying said column lines with a reference voltage potential;

a second potential source connected to said memory cells for supplying said memory cells with a second potential source voltage;

a dummy row line identical in structure with said row lines;

a dummy column line identical in structure with said column lines;

a plurality of dummy cells comprising a plurality of MOS FETs connected to said dummy row line and said dummny column line in such a manner that the source electrodes of said MOS FETs are connected to said second potential source and the drain electrodes of said MOS FETs arranged in said dummy column line are connected to said dummy column line and the drain electrodes of said MOS FETs arranged in said dummy row line are connected respectively to said column lines and to said dummy column line; and an error detecting and preventing circuit for detecting the potential of said dummy column line and for supplying a signal to the gate electrodes of said MOS FETs arranged in said dummy row line when the potential of the dummy column line becomes a potential opposite to that of the first potential source, thereby rendering said dummy row line MOS FETs conductive and connecting said column lines and said dummy column line to said second potential source and rendering said MOS FETs non-conductive when the potential of said column lines and said dummy column line becomes substantially equal to the voltage supplied from said second potential source.

11. A memory device utilizing metal oxide semiconductor field effect transistors (MOS FETs) formed in a semiconductor substrate, comprising:

a plurality of row lines through which input signals are supplied;

a row decoder for selecting any one of said row lines;

a plurality of column lines through which output signals are supplied;

a column decoder for selecting any one of said column lines;

a plurality of memory cells connected to said row and column lines in such a manner that each receives an input signal through the row line to which it is connected and supplies an output signal through the column line to which it is connected;

a signal sensing circuit connected to said column lines for detecting an output signal supplied thereon and for supplying an output circuit with a readout signal;

a first potential source connected to said column lines through a load element for supplying said column lines with a reference voltage potential;

a second potential source connected to said memory cells for supplying said memory cells with a second potential source voltage;

a dummy row line identical in structure with said row lines;

a dummy column line identical in structure with said column lines;

a plurality of dummy cells comprising a plurality of MOS FETs connected to said dummy row line and said dummy column line in such a manner that the drain electrodes of said MOS FETs are connected to said second potential source and the source electrodes of said MOS FETs arranged in said dummy column line are connected to said dummy column line and the source electrodes of said MOS FETs arranged in said dummy row line are connected respectively to said column lines; and an error detecting and preventing circuit for detecting the potential of said dummy column line and for supplying a signal to the gate electrodes of said MOS FETs when the potential of said dummy column line becomes a potential opposite to that of said first potential source, thereby rendering said MOS FETs conductive and connecting the column lines and said dummy column line to said second potential sources and rendering said MOS FETs non-conductive when the potential of said column lines and said dummy column line becomes substantially equal to the voltage supplied from said second potential source.

12. A memory device utilizing metal oxide semiconductor field effect transistors (MOS FETs) formed in a semiconductor substrate, comprising:

a plurality of row lines through which input signals are supplied;

a row decoder for selecting any one of said row lines;

a plurality of column lines through which output signals are supplied;

a column decoder for selecting any one of said column lines;

a plurality of memory cells connected to said row and column lines in such a manner that each receives an input signal through the row line to which it is connected and supplies an output signal through the column line to which it is connected;

a signal sensing circuit connected to said column lines for detecting an output signal supplied thereon and for supplying an output circuit with a readout signal;

a first potential source connected to said column lines through a load element for supplying said column lines with a reference voltage potential;

a second potential source connected to said memory cells for supplying said memory cells with a second potential source voltage;

a dummy row line identical in structure with said row lines;

a dummy column line identical in structure with said column lines;

a plurality of dummy cells comprising a plurality of MOS FETs connected to said dummy row line and said dummy column line in such a manner that the source electrodes of said MOS FETs arranged in said dummy row line are connected to said first potential source while the source electrodes of said MOS FETs arranged in said dummy column line are connected to said second potential source, the drain electrodes of said dummy column MOS FETs being connected to said dummy column line and the drain electrodes of said dummy row MOS FETs being connected respectively to said column lines and to said dummy column line; and an error detecting and preventing circuit for detecting the potential of said dummy column line and for supplying a signal to the gate electrodes of said dummy row MOS FETs when the potential of said dummy column line becomes a potential opposite to that of said first potential source, thereby rendering said MOS FETs conductive and connecting said column lines and said dummy column line to said first potential source and rendering said MOS FETs non-conductive when the potential of said column lines and said dummy column line becomes substantially equal to the voltage supplied from said first potential source.

13. A memory device utilizing metal oxide semiconductor field effect rransistors (MOS FETs) formed in a semiconductor substrate, comprising;

a plurality of row lines through which input signals are supplied;

a row decoder for selecting any one of said row lines;

a plurality of column lines through which output signals are supplied;

a column decoder for selecting any one of said column lines;

a plurality of memory cells connected to said row and column lines in such a manner that each receives an input signal through the row line to which it is connected and supplies an output signal through the column line to which it is connected;

a signal sensing circuit connected to said column lines for detecting an output signal supplied thereon and for supplying an output circuit with a readout signal;

a first potential source connected to said column lines through a load element for supplying said column lines with a reference voltage potential;

a second potential source connected to said memory cells for supplying said memory cells with a second potential source voltage;

a dummy row line identical in structure with said row lines;

a dummy column line identical in structure with said column lines;

a plurality of dummy cells identical in structure with said memory cells comprising a plurality of MOS FETs connected to said dummy row line and said dummy column line in such a manner that the drain electrodes of said MOS FETs are connected to said first potential source and the source electrodes of said MOS FETs arranged in said dummy column line are connected to said dummy column line and the source electrodes of said MOS FETs arranged in said dummy row line are connected respectively to said column lines; and an error detecting and preventing circuit for detecting the potential of said dummy column line and for supplying a signal to the gate electrodes of said MOS FETs when the potential of said dummy column line becomes a potential opposite to that of said first potential source, thereby rendering said MOS FETs conductive and connecting said column lines and said dummy column line to said first potential source and rendering said MOS FETs non-conductive when the potential of said column lines and said dummy column line becomes substantially equal to the voltage supplied from said first potential source.

14. A memory device according to claim 1, 2, 5, 6, 7, 8, 9, 10, 11, 12, or 13, wherein said memory cells comprise a plurality of MOS FETs each having its drain electrode connected to a column line, its source electrode connected to said second potential source, and its gate electrode connected to a row line respectively.

15. A memory device according to claim 1, 2, 5, 6, 7, 8, 9, 10, 11, 12, or 13, wherein said memory cells comprise a plurality of MOS FETs each having its source electrode connected to a column line, its drain electrode connected to said second potential source, and its gate electrode connected to a row line respectively.

16. A memory device according to claim 1, 2, 5, 6, 7, 8, 9, 10, 11, 12, or 13, wherein said load element is a depletion type MOS FET.

* * * * *